(12) United States Patent
Van Der Vleuten et al.

(10) Patent No.: US 6,229,463 B1
(45) Date of Patent: May 8, 2001

(54) ARITHMETIC ENCODING/DECODING OF A MULTI-CHANNEL INFORMATION SIGNAL

(75) Inventors: Renatus J. Van Der Vleuten; Alphons A. M. L. Bruekers, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/268,252

(22) Filed: Mar. 15, 1999

(30) Foreign Application Priority Data

Mar. 16, 1998 (EP) .................................................. 98200820

(51) Int. Cl.[7] .................................................. H03M 7/00
(52) U.S. Cl. ........................................... 341/107; 358/426
(58) Field of Search ............................. 341/107, 67, 106; 358/13, 426, 429; 348/408

(56) References Cited

U.S. PATENT DOCUMENTS

| | | | |
|---|---|---|---|
| 4,075,655 | * 2/1978 | Iijima et al. | 358/13 |
| 5,339,108 | * 8/1994 | Coleman et al. | 348/408 |
| 5,424,733 | * 6/1995 | Fimoff et al. | 341/67 |
| 5,583,500 | * 12/1996 | Allen et al. | 341/107 |
| 5,592,163 | * 1/1997 | Kimura et al. | 341/107 |
| 5,736,947 | * 4/1998 | Imanaka | 341/107 |
| 6,055,273 | * 4/2000 | Isomura | 341/106 |

* cited by examiner

*Primary Examiner*—Howard L. Williams
*Assistant Examiner*—Jean Bruner Jeanglaude
(74) *Attorney, Agent, or Firm*—Michael E Belk (57) ABSTRACT

A data compression apparatus is disclosed for data compressing a plurality of information signals. The data compression apparatus comprises input terminals (1,2) for receiving the information signals, prediction units (6,8) for carrying out a prediction step on the plurality of information signals so as to obtain a plurality of prediction signals, probability signal determining units (12,14) for generating in response to the plurality of information signals a corresponding plurality of probability signals, a first switching unit (4) for each time selecting a symbol in one a plurality of input signals applied to the first switching unit, a second switching unit (10) for each time selecting a probability signal corresponding to the symbol selected by the first switching unit, a control signal generator unit (24) for generating switching control signals for the first and second switching units (4,10), a lossless coding unit (18) and an output terminal (22) for supplying said data compressed output signal.

27 Claims, 5 Drawing Sheets

ARITHMETIC ENCODING/DECODING OF A MULTI-CHANNEL INFORMATION SIGNAL

FIELD OF THE INVENTION

The invention relates to the field of lossless data compression.

BACKGROUND OF THE INVENTION

The invention relates to a data compression apparatus for data compressing a plurality of at least two digital information signals. The invention also relates to a data compression method, to a data expansion apparatus, to a transmission apparatus provided with the data compression apparatus, to a record carrier obtained with the transmission apparatus and to a receiver apparatus provided with the data expansion apparatus.

The data compression and expansion aimed at hereafter is data compression/expansion based on lossless coders, more specifically arithmetic coders/decoders.

Lossless coding using arithmetic coders has been extensively described in document F. Bruekers et al, "Improved lossless coding of 1-bit audio signals", presented at the 103rd Convention of the AES, Sep. 26–29, 1997, preprint 4563 (I-6). Further, G. G. Langdon, "An introduction to arithmetic coding", IBM J. Res. Develop., Vol. 28, pp. 135–149, March 1984 and P. G. Howard et al., "Arithmetic coding for data compression", in Proc. of the IEEE, 1994 give an extensive introduction into data compression and expansion using arithmetic coders/decoders.

SUMMARY OF THE INVENTION

The invention aims at providing data compression/expansion on a plurality of digital information signals. The data compression apparatus in accordance with the invention includes input apparatus for receiving the plurality of information signals, prediction apparatus for carrying out a prediction step on the plurality of information signals so as to obtain a plurality of prediction signals, probability signal determining apparatus for generating in response to the plurality of prediction signals a corresponding plurality of probability signals, first switching apparatus for each time selecting a symbol in one of a plurality of input signals applied to the first switching means, second switching apparatus for each time selecting a probability signal corresponding to the symbol selected by the first switching means, control signal generator apparatus for generating switching control signals for the first and second switching means, lossless coding apparatus having an input for receiving symbols selected by the first switching apparatus, for carrying out a lossless encoding step on symbols, so as to obtain a data compressed output signal at an output, the lossless encoding apparatus including an entropy encoder for carrying out the lossless encoding step on the input signal in response to the probability signals selected by the second switching apparatus, output apparatus for supplying the data compressed output signal.

In this way, only one arithmetic coder is required for encoding a plurality of digital information signals. Further, smaller buffers are required, for the reason that each time one symbol of the plurality of digital information signals is multiplexed into a serial datastream that is supplied to the arithmetic coder.

BRIEF DESCRIPTION OF THE PREFERRED EMBODIMENT

These and other aspects of the invention will be apparent from and elucidated further with reference to the embodiments described in the following figure description, in which.

DETAILED DESCRIPTION OF THE PREFERRED EMBODIMENT

Figure 1:
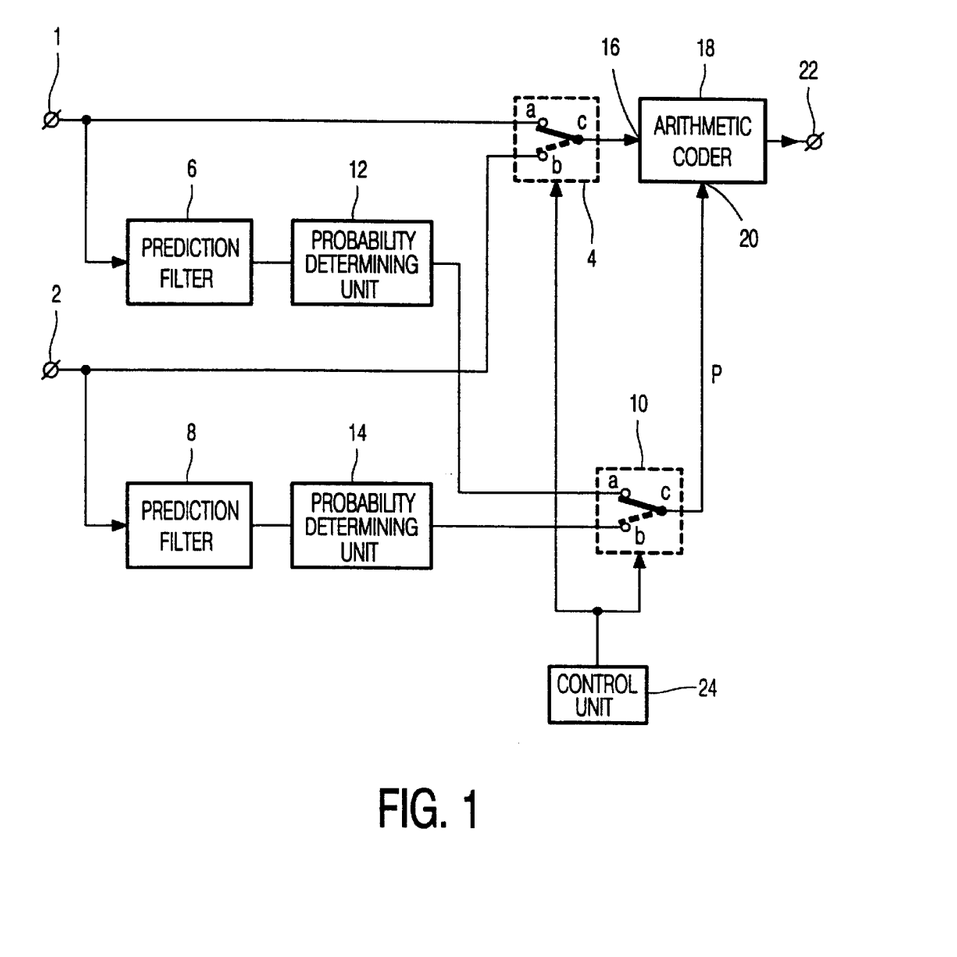
FIG. 1 shows a first embodiment of the data compression apparatus.

FIG. 1 shows a first embodiment of a data compression apparatus for arithmetically encoding a multi-channel information signal. The apparatus of FIG. 1 is adapted to encode a 2-channel information signal, such as the left and right hand signal components of a stereo audio signal. The signal components can be in digital form, such as in the form of a bitstream signal or in the form of an n-level digital signal, where n is larger than 2. The apparatus includes two inputs 1 and 2 for receiving the left and right hand signal components, respectively. The inputs 1 and 2 are coupled to an a-terminal and a b-terminal, respectively of a switch 4, as well as to an input of a prediction filter 6 and 8, respectively. An output of the prediction filter 6 is coupled to an a-terminal of a switch 10 via a probability determining unit 12. An output of the prediction filter 8 is coupled to the b-terminal of the switch 10 via a probability determining unit 14. A c-terminal of the switch 4 is coupled to an information signal input 16 of an arithmetic coder 18. The c-terminal of the switch 10 is coupled to a probability signal input 20 of the arithmetic coder 18. The output of the arithmetic coder 18 is coupled to an output terminal 22 of the apparatus. A control unit 24 is available for generating a switching control signal to the switches 4 and 10.

The prediction filter 6 realizes a prediction filtering on the input signal supplied to the input 1 so as to obtain a predicted version of the input signal, which is in the form of a multi value output signal. The probability determining unit 12 generates a probability signal in response to this multi value output signal. In an identical way, the prediction filter 8 realizes a prediction filtering on the input signal supplied to the input 2 so as to obtain a predicted version of the input signal, which is in the form of a multi value output signal. The probability determining unit 14 generates a probability signal in response to this multi value output signal. More specifically, the probability determining units 12 and 14 each supply probability values indicating the probability of occurrence of each of the symbol values of the symbols occurring in the serial datastream of the input signals applied to the inputs 1 and 2, respectively.

The control unit 24 controls the switches in such a way that they both are either in the position a-c or in the position b-c. Further, via the switches 4 and 10, alternately, symbols of the one or the other input signal, with their corresponding probability signals are supplied to the arithmetic coder 18. In this way, the two signal components are interleaved and subsequently encoded by the arithmetic coder 18.

Various embodiments of the prediction filters 6,8 and the probability determining units 12,14 are possible. In one embodiment, the prediction filters and the probability determining units are static (fixed) unit, in the sense that their behaviour does not change in time. In a second embodiment, the filters 6,8 are adaptive, so that they can adapt themselves to changing input signal characteristics. In another embodiment, the probability determining units 12,14 can (also) be adaptive. When adaptive, the serial datastream of an input signal is subdivided into frames of information and for each frame, the prediction filter and the probability determining unit are adapted to the content of the frame: that is: the coefficients of the prediction filter are derived so as to obtain the best prediction of the signal content in the frame and the probabilities are derived by comparing the original digital information signal in the frame with the corresponding multi-value output signal of the prediction filter.

For each of a plurality of subintervals in the value range of the multi value output signal, the probability of each of the n levels of the information signal is obtained by counting the number of times each of the n levels occurs, during a specific time interval (e.g. one frame), when the multi value output signal falls in the range of the subinterval. For example, if n=3 and the levels in the information signal are −1, 0, and +1, the multi value output signal of the prediction filter can lie within a range of e.g. −3 and +3. One subinterval of this range could e.g. be the range of 1 to 1.5. The counts obtained for each of the levels, when the multi value output signal falls in the range of 1 to 1.5 could e.g. be 1000, 3000, and 6000 for the levels −1, 0, and +1, respectively. The probabilities would then be 0.1, 0.3, and 0.6, respectively, for those levels, when the multi value output signal falls in the subinterval with the range of 1 to 1.5.

Figure 2:
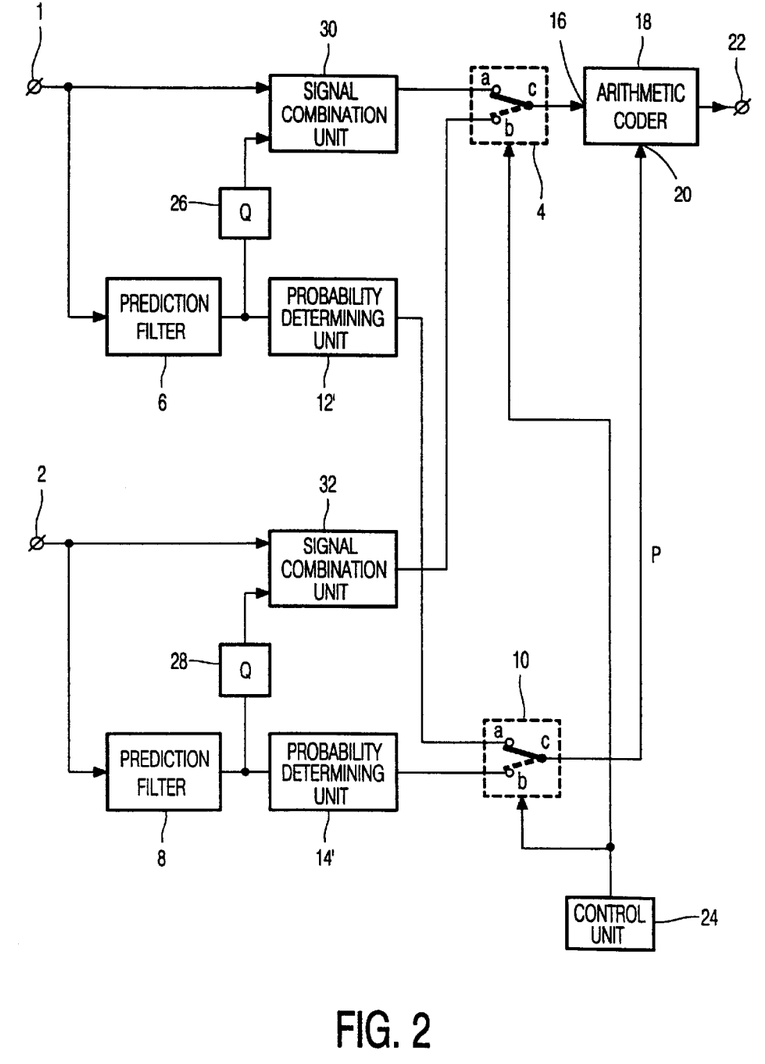
FIG. 2 shows a second embodiment of the data compression apparatus.

FIG. 2 shows a second embodiment of the data compression apparatus for arithmetically encoding a multi-channel information signal. The apparatus of FIG. 2 differs from the apparatus of FIG. 1, in that the apparatus of FIG. 2 includes quantizer units 26 and 28, having an input coupled to the outputs of the prediction filter units 6 and 8, respectively. Further, signal combination units 30 and 32, having first inputs coupled to the input terminals 1 and 2, respectively, second inputs coupled to the outputs of the quantizer units 26 and 28, respectively, and outputs coupled to the a-terminals of the switches 4 and 10, respectively.

The functioning of the prediction filter unit 6, the probability determining unit 12', the signal combination unit 30 and the quantizer unit 26 is as follows. The quantizer unit 26 is adapted to quantize the multivalue signal of the prediction filter unit 6 into an n-level output signal, which is the predicted version of the n-level information signal, applied to the input terminal 1. For the case of a 1-bit bitstream signal, n=2, the predicted version of the information signal is also a signal in the form of a serial datastream of 'zeroes' and 'ones'. The signal combination unit 30 combines the information signal and the predicted version of the information signal in a subtractive way so as to obtain a residual signal, which is supplied to its output. The advantage of generating a residual information signal is that, by combining the n-level information signal and the predicted version thereof, the probability of symbols with zero level in the residual signal is significantly increased. This can simplify the subsequent data compression in the arithmetic coder 18.

The probability determining unit 12' now generates one or more probability values (the number of which is dependent of n), indicating the probability that a symbol of the residual information signal supplied by the combination unit has a predetermined value. This (these) probability value(s) is (are) thus supplied to the arithmetic coder, together with the corresponding symbol in the residual signal so as to enable data compression in the arithmetic coder 18.

It should be noted that the probability values for data compressing the residual signal are obtained from the prediction signal from the prediction filter 6 and not from the residual signal itself. This has the advantage that a higher data compression rate can be obtained with the arithmetic coder 18.

As stated above, both the filter 6 and the unit 12' can be static, or they can be adaptive. The prediction filter 6 realizes a prediction filtering on the n-level information signal so as to obtain the multi value output signal. The multi value output signal lies within a range of eg. +3 and −3. The quantizer 26 receives the multi value output signal and generates a predicted version of the n-level information signal therefrom, eg. (if n=3 and the levels are −1, 0 and +1) by allocating a value of '+1' if the multi value output signal is eg. larger than +1, by allocating a value '−1' if the multi value prediction signal is smaller than −1 and by allocating a value '0', if the multi value prediction signal lies between −1 and +1.

The residual information signal can have values '−2', '−1''0', '+1' and '+2'. For each of a plurality of subintervals in the value range of the multi value output signal, it is determined what the probability is that the corresponding value of the residual signal is eg. '+1'. In the adaptive embodiment of the unit 12', this can be realized by counting the number of '+2's, '+1's, '0's, '−1's and '−2's occurring in the residual information signal during a specific time interval, when the multi value output signal falls in one of such ranges. The probabilities thus obtained for the various values in the multi value output signal are subsequently supplied as the probability signal to the arithmetic coder 18.

The functioning of the prediction filter unit 8, the probability determining unit 14=, the signal combination unit 32 and the quantizer unit 28 is identical to the functioning described above and therefore needs no further explanation.

After multiplexing of both residual signals by the switch 4 into a composite residual signal, and the multiplexing of the probabilities by the switch 10, the arithmetic coder 18 carries out a data compression on the composite residual signal, resulting in a data compressed output signal which is supplied to the terminal 22, for transmission via a transmission medium or for recording.

Figure 3:
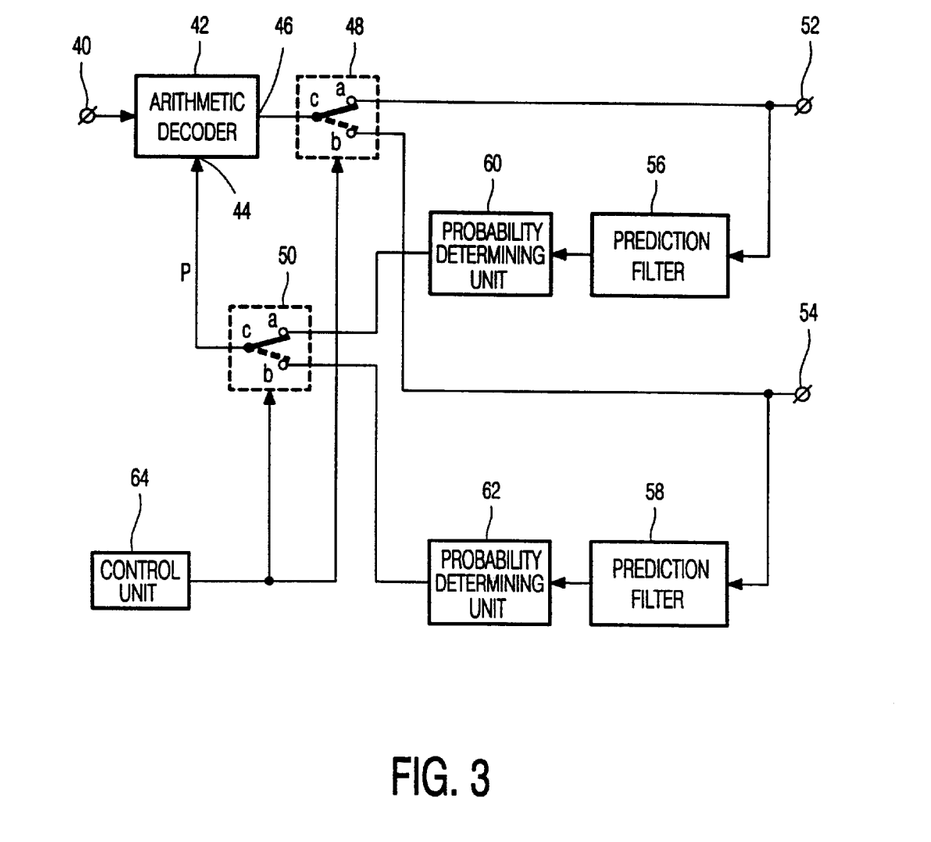
FIG. 3 shows a first embodiment of the data expansion apparatus.

FIG. 3 shows an embodiment of a data expansion apparatus for decoding the data compressed signal supplied by the encoder of FIG. 1 to the decoder via the transmission medium or a record carrier, such as an optical record carrier. FIG. 3 shows an expansion apparatus having an input terminal 40 coupled to an input of an arithmetic decoder 42 that carries out an arithmetic decoding step on the data compressed composite information signal, under the influence of a probability signal p, supplied to a control input 44 so as to generate a replica of the composite information signal which is supplied to an output 46. The output 46 of the decoder 42 is coupled to a c-terminal of a switch 48, which has an a-terminal coupled to an output terminal 52 as well as to an input 52 of a prediction filter 56. Further, a b-terminal of the switch 48 is coupled to an output terminal 54 as well as to an input of a prediction filter 58. The output of the prediction filter 56 is coupled to an input of a probability determining unit 60. The probability determining unit 60 has an output which is coupled to an a-terminal of a switch 50. The output of the prediction filter 58 is coupled to an input of a probability determining unit 62. The probability determining unit 62 has an output which is coupled to an b-terminal of the switch 50. The c-terminal of the switch 50 is coupled to the control input 44 of the decoder 42.

Further, a control unit 64 is available for supplying a switching control signal for the controllable switches 48 and 50.

The data expansion apparatus of FIG. 3 is complementary to the data compression apparatus of FIG. 1, in the sense that, if the prediction filters and the probability determining units in the apparatus of FIG. 1 are fixed, the prediction filters and the probability determining units in the apparatus of FIG. 3 are fixed, or that, if the prediction filters and the probability determining units in the apparatus of FIG. 1 are adaptive, that also the filters and the probability determining units in the apparatus of FIG. 3 are adaptive.

When the filters are adapted, it is required to transmit side information from the compression apparatus to the expansion apparatus. Such side information can include the filter coefficients. When, the probability determining units are adaptive, it is also required to transmit side information to the expansion apparatus, such side information including information concerning the conversion of the multi-level information signal supplied by the filters into the probabilities generated in response thereto by the probability determining units.

When symbols in the composite compressed signal, that belonged to the information signal applied to the input 1 of the apparatus of FIG. 1, are available for decoding in the decoder 42 (that is: ready for data expansion), the control unit 64 generates a control signal, such that the switch 50 is set into its position a-c, so that the probability value corresponding to the symbol, generated by the probability determining unit 60 can be applied to the control input 44 of the decoder 42. Further, also the switch 48 is set into its position a-c, so that the decoded symbol occurring at the output 46 is supplied to the output terminal 52.

When symbols in the composite compressed signal, that belonged to the information signal applied to the input 2 of the apparatus of FIG. 1, are available for decoding in the decoder 42 (that is: ready for data expansion), the control unit 64 generates a control signal, such that the switch 50 is set into its position b-c, so that the probability value corresponding to the symbol, generated by the probability determining unit 62 can be applied to the control input 44 of the decoder 42. Further, also the switch 48 is set into its position b-c, so that the decoded symbol occurring at the output 46 is supplied to the output terminal 54. In this way, the original information signals can be regenerated.

Figure 4:
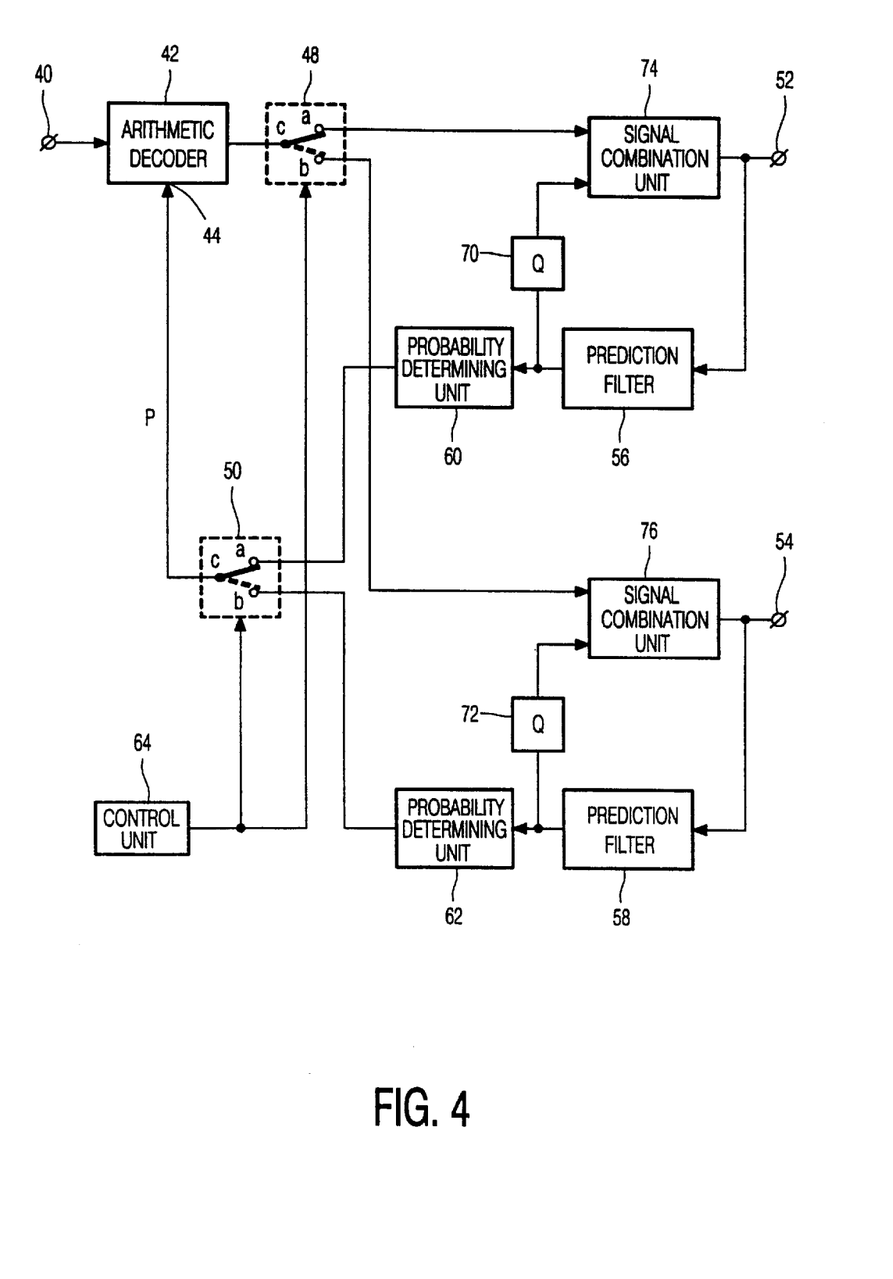
FIG. 4 shows a second embodiment of the data expansion apparatus.

FIG. 4 shows a data expansion apparatus for decoding the data compressed signal, received via the transmission or recording medium from the apparatus of FIG. 2. The apparatus of FIG. 4 shows a large resemblance with the apparatus of FIG. 3, with the difference that that apparatus of FIG. 4 further includes quantizers 70 and 72 and a signal combination units 74 and 76. The quantizer 70 has an input coupled to the output of the prediction filter 56, and an output which is coupled to a first input of the signal combination unit 74. The signal combination unit 74 has a second input which is coupled to the a-terminal of the switch 48. The output of the signal combination unit 74 is coupled to the output terminal 52 and to the input of the prediction filter 56. The quantizer 72 has an input coupled to the output of the prediction filter 58, and an output which is coupled to a first input of the signal combination unit 76. The signal combination unit 76 has a second input which is coupled to the b-terminal of the switch 48. The output of the signal combination unit 76 is coupled to the output terminal 54 and to the input of the prediction filter 58.

The decoder 42 receives the data compressed residual composite signal via the input terminal 40. The decoder 42 carries out an arithmetic decoding step on the data compressed residual composite signal under the influence of the probability signal p, supplied to the control input 44 so as to generate a replica of original residual composite signal which is supplied to the c-terminal of the switch 48. Under the influence of the switching control signal generated by the control unit 64, the composite signal is split into replicas of the original residual signals. Those residual signals are supplied to the second inputs of the signal combination units 74 and 76. Via their first inputs, they receive predicted versions of the original information signals, so that by combining a predicted version of an information signal and its corresponding residual signal in an additive sense in a signal combination unit, the replica of the original information signal is obtained.

The functioning of the prediction filters 56 and 58, the quantizers 70 and 72 and the probability determining units 60 and 62 is again identical to the functioning of the corresponding elements in the apparatus of FIG. 2.

The arithmetic encoder used in the embodiments of FIG. 1 and 2 is adapted to encode an n-level signal (either the n-level composite information signal, or the n-level composite residual signal) using a probability signal in order to obtain the data compressed signal. Instead of using an arithmetic coder, one could have used a well known finite state coder. The arithmetic decoder used in the embodiment of FIG. 2 is adapted to decode the data compressed information signal using a probability signal in order to obtain a replica of the n-level information signal.

Figure 5:
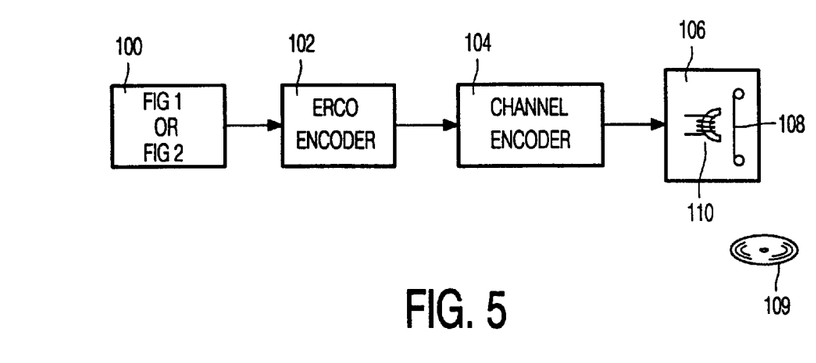
FIG. 5 shows a data compression apparatus incorporated in a transmitter, which is in the form of as a recording apparatus.

FIG. 5 shows an embodiment of a transmission apparatus which is in the form of a recording apparatus. The recording apparatus includes the data compression apparatus shown in FIG. 1 or 2. The recording apparatus further includes a write unit 106 for writing the data compressed signal generated by the apparatus of FIG. 1 or 2 in a track on the record carrier 108. In the present example, the record carrier 108 is a magnetic record carrier, so that the write unit 106 includes at least one magnetic head 110 for writing the data compressed n-level information signal in the record carrier 108. The record carrier may however be an optical record carrier 109, such as a CD disk or a DVD disk.

Transmission via a transmission medium, such as a radio frequency link or a record carrier, generally requires an error correction encoding and a channel encoding carried out on the data compressed signal to be transmitted. FIG. 5 shows such signal processing steps. The recording apparatus of FIG. 5 therefore includes an error correction encoder 102, well known in the art, and a channel encoder 104, also well known in the art.

Figure 6:
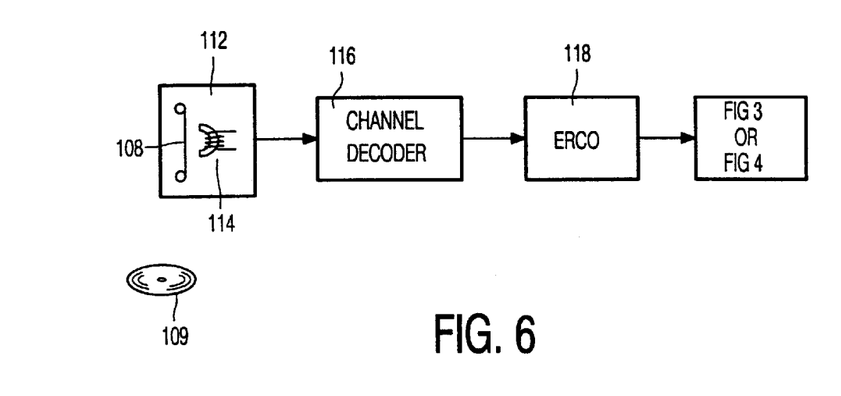
FIG. 6 shows a data expansion apparatus incorporated in a receiver, which is in the form of a reproduction apparatus.

FIG. 6 shows the data expansion apparatus of FIG. 3 or 4 incorporated in a receiver apparatus, which is in the form of a reproduction apparatus. The reproducing apparatus further includes a read unit 112 for reading the data compressed composite signal from a track on the record carrier 108. In the present example, the record carrier 108 is a magnetic record carrier, so that the read unit 112 includes at least one magnetic head 114 for reading the data compressed n-level information signal from the record carrier 108. The record carrier may however be an optical record carrier 109, such as a CD disk or a DVD disk.

As has been explained above, transmission via a transmission medium, such as a radio frequency link or a record carrier, generally requires an error correction encoding and a channel encoding carried out on the data compressed n-level information signal to be transmitted, so that a corresponding channel decoding and error correction can be carried out upon reception. FIG. 6 shows the signal processing steps of channel decoding and error correction carried out on the received signal, received by the reading apparatus 112. The reproducing apparatus of FIG. 6 therefore includes a channel decoder 116, well known in the art, and an error correction unit 118, also well known in the art, so as to obtain a replica of the data compressed n-level information signal.

Whilst the invention has been described with reference to preferred embodiments thereof, it is to be understood that these are not limitative examples. Thus, various modifications may become apparent to those skilled in the art, without departing from the scope of the invention, as defined by the claims.

Further, the invention lies in each and every novel feature or combination of features.

REFERENCES (D1) F. Bruekers et al, >Improved lossless coding of 1-bit audio signals=, presented at the 103rd Convention of the AES, Sep. 26–29, 1997, preprint 4563 (I-6)

(D2) G.G. Langdon, >An introduction to arithmetic coding=, IBM J. Res. Develop., Vol, 28, pp. 135–49, March 1984.

(D3) P.G. Howard et al., >Arithmetic coding for data compression=, in Proc. of the IEEE, 1994.

What is claimed is:

1. Data compression apparatus comprising:

input means for receiving a plurality of information signals;

means for predicting a corresponding plurality of prediction signals from the plurality of information signals;

means for determining a corresponding plurality of probability signals from the plurality of prediction signals;

first switching means for each time selecting a symbol from one of the plurality of input signals;

second switching means for each time selecting from the plurality of probability signals, a probability signal corresponding to the symbol selected by the first switching means;

means for generating switching control signals for controlling the selecting of the first and second switching means;

means for losslessly encoding the symbols selected from the plurality of input signals into a data compressed output signal in response to the corresponding probability signals selected from the plurality of probability signals; and output means for supplying the data compressed output signal.

2. The apparatus of claim 1, wherein the plurality of information signals are the plurality of input signals for the first switching means.

3. The apparatus of claim 1, wherein the apparatus further comprises:

means for quantizing the plurality of prediction signals into predicted versions of the plurality of information signals; and signal combination means to combine corresponding information signals and predicated version of the input signals into a plurality of residual signals as the plurality of input signals for the first switching means.

4. The apparatus of claim 1, wherein the lossless encoding means include an entropy encoder for losslessly encoding the symbols selected from a plurality of input signals in response to the corresponding probability signals selected from the plurality of probability signals.

5. The apparatus of claim 4, wherein the entropy encoder includes an arithmetic encoder.

6. A data compression method comprising the steps of:

receiving the plurality of information signals;

predicting corresponding prediction signals from the plurality of information signals;

predicting a corresponding plurality of probability signals from the plurality of prediction signals;

generating switching control signals;

each time selecting a symbol from one of a plurality of input signals in response to the switching control signals;

each time selecting from the plurality of probability signals, a probability signal corresponding to the selected symbol in response to the switching control signals;

losslessly encoding the symbols selected from the plurality of input signals into a data compressed output signal in response to the corresponding probability signals selected from the plurality of probability signals;

supplying the data compressed output signal.

7. A record carrier containing a data compressed output signal obtained by the method of claim 6.

8. The method of claim 6, wherein the lossless encoding includes entropy encoding for losslessly encoding the symbols selected from a plurality of input signals in response to the corresponding probability signals selected from the plurality of probability signals.

9. Data expansion apparatus comprising:

input means for receiving a data compressed input signal;

means for losslessly decoding the data compressed input signal into a data expanded output signal in response to a corresponding probability signal selected from a plurality of probability signals;

first switching means for selecting subsequent symbols from the data expanded output signal for cyclically supplying each of the symbols to one of a plurality of output signals;

output means for outputting a plurality of data expanded information signals;

means for predicting a plurality of prediction signals from the plurality of information signals;

means for determining corresponding probability signals from the plurality of prediction signals; and second switching means for each time selecting a probability signal from the plurality of probability signals for supplying the selected probability signal to the lossless decoding means.

10. The apparatus of claim 9, wherein the plurality of output signals are the plurality of information signals.

11. The apparatus of claim 9, wherein the apparatus further comprises:

means for quantizing the plurality of prediction signals into corresponding predicted versions of the plurality of information signals; and means to combine corresponding output and predicted versions of the information signals into the plurality of information signals.

12. The apparatus of claim 9, wherein the lossless decoding means include an entropy decoder for losslessly decoding the data compressed input signal in response to the corresponding probability signals selected from the plurality of probability signals.

13. The apparatus of claim 12, wherein the entropy decoder includes an arithmetic decoder.

14. A data expansion method comprising the steps of:

receiving the data compressed input signal;

losslessly decoding the data compressed input signal into a data expanded output signal in response to a corresponding probability signal selected from a plurality of probability signals;

selecting subsequent symbols in the data expanded output signal for cyclically supplying each of the symbols to one of a plurality of output signals;

outputting a plurality of data expanded information signals;

predicting a corresponding plurality of prediction signals from the plurality of information signals;

generating a corresponding plurality of probability signals from the plurality of prediction signals; and each time selecting a probability signal from the plurality of probability signals for supplying the selected probability signal to the lossless decoding means.

15. The method of claim 14, wherein the lossless decoding includes entropy decoding for losslessly decoding the data compressed input signal in response to the corresponding probability signals selected from the plurality of probability signals.

16. A transmitter, comprising:

input means for receiving a plurality of information signals;

prediction means for predicting a plurality of prediction signals from the plurality of information signals;

means for determining a corresponding plurality of probability signals from the plurality of prediction signals;

first switching means for each time selecting a symbol from one of a plurality of input signals applied to the first switching means;

second switching means for each time selecting a probability signal corresponding to the symbol selected by the first switching means;

means for generating switching control signals for the first and second switching means;

means for losslessly encoding the symbols selected from the plurality of input signals into a data compressed output signal in response to the corresponding probability signals selected from a plurality of probability signals;

means for supplying the data compressed output signal;

means for error correction encoding and/or channel encoding the output signal of the entropy encoder; and transmission means for applying the error correction encoded and/or channel encoded output signal of the entropy encoder to a transmission medium.

17. The transmitter of claim 16, wherein the transmission means includes writing means for writing the error correction encoded and/or channel encoded output signal of the entropy encoder on a record carrier.

18. The transmitter of claim 17, wherein the record carrier is an optical or a magnetic record carrier.

19. The apparatus of claim 16, wherein the plurality of information signals are the plurality of input signals for the first switching means.

20. The transmitter of claim 16, wherein the lossless encoding means include an entropy encoder for losslessly encoding the symbols selected from a plurality of input signals in response to the corresponding probability signals selected from the plurality of probability signals.

21. The apparatus of claim 20, wherein:

the apparatus further comprises: means to quantize the plurality of prediction signals into predicted versions of the plurality of information signals; and means to combine corresponding information and prediction signals respectively from the plurality of information signals and the plurality of prediction signals into a plurality of residual signals, the plurality of residual signals being the plurality of input signals for the first switching means; and the entropy encoder includes an arithmetic coder.

22. A receiver comprising:

input means for receiving the data compressed input signal;

means for losslessly decoding the data compressed input signal into a data expanded output signal in response to a corresponding probability signal selected from a plurality of probability signals;

first switching means for selecting subsequent symbols in the data expanded output signal and for cyclically supplying each of the symbols to one of a plurality of output signals;

output means for outputting a plurality of data expanded information signals;

means for predicting a plurality of corresponding prediction signals from the plurality of information signals;

means for determining a corresponding plurality of probability signals from the plurality of prediction signals;

second switching means for each time selecting a probability signal from the plurality of probability signals for supplying the selected probability signal to the lossless decoding means; and means for retrieving a channel encoded and/or error correction encoded transmission signal from a transmission medium, means for channel decoding and/or error correcting the channel encoded and/or error correction encoded transmission signal into the input signal for the entropy decoder.

23. The apparatus of claim 22, wherein the plurality of output signals are the plurality of information signals.

24. The receiver of claim 22, wherein the lossless decoding means include an entropy decoder for losslessly decoding the data compressed input signal in response to the corresponding probability signals selected from the plurality of probability signals.

25. The apparatus of claim 24, wherein:

the apparatus further comprises: means to quantize the plurality of prediction signals into predicted versions of the plurality of information signals; and means to combine corresponding output and the predicted versions of information signals into the plurality of information signals; and the entropy decoder includes an arithmetic decoder.

26. The receiver of claim 22, wherein, the transmission medium includes a record carrier; the receiving means includes means for reading an error correction encoded and/or channel encoded transmission signal from the record carrier.

27. Receiver as claimed in claim 26, wherein the record carrier is an optical or a magnetic record carrier.

* * * * *